US010374586B2

(12) United States Patent
Takagi

(10) Patent No.: US 10,374,586 B2
(45) Date of Patent: Aug. 6, 2019

(54) SLEW RATE ADJUSTING CIRCUIT AND SLEW RATE ADJUSTING METHOD

(71) Applicant: NEC Corporation, Minato-ku, Tokyo (JP)

(72) Inventor: Takuya Takagi, Tokyo (JP)

(73) Assignee: NEC CORPORATION, Tokyo (JP)

(*) Notice: Subject to any disclaimer, the term of this patent is extended or adjusted under 35 U.S.C. 154(b) by 0 days.

(21) Appl. No.: 15/718,121

(22) Filed: Sep. 28, 2017

(65) Prior Publication Data
US 2018/0109245 A1    Apr. 19, 2018

(30) Foreign Application Priority Data

Oct. 14, 2016   (JP) .................................. 2016-202642

(51) Int. Cl.
*H03K 5/06*    (2006.01)
*H03K 5/26*    (2006.01)
*H03K 5/00*    (2006.01)

(52) U.S. Cl.
CPC ................. *H03K 5/06* (2013.01); *H03K 5/26* (2013.01); *H03K 2005/00019* (2013.01)

(58) Field of Classification Search
CPC ................................... H03K 5/12; H03K 5/06
See application file for complete search history.

(56) References Cited

U.S. PATENT DOCUMENTS

| | | | | |
|---|---|---|---|---|
| 6,924,658 B2* | 8/2005 | Peng | ................ | G01R 31/31901 324/750.3 |
| 7,038,512 B2* | 5/2006 | Wilson | ................ | H03K 5/01 327/112 |
| 7,038,513 B2* | 5/2006 | Wilson | ................ | H03K 5/023 327/112 |
| 7,109,768 B2* | 9/2006 | Rashid | ................ | H03K 5/12 327/170 |
| 7,288,958 B2* | 10/2007 | Takagi | ................ | H03K 5/01 326/26 |
| 7,432,730 B2* | 10/2008 | Bucossi | ................ | H03K 19/00369 326/21 |

(Continued)

FOREIGN PATENT DOCUMENTS

| | | |
|---|---|---|
| JP | 2000-174594 A | 6/2000 |
| JP | 2006-245816 A | 9/2006 |
| JP | 2011-044795 A | 3/2011 |

OTHER PUBLICATIONS

Japanese Office Action for JP Application No. 2016-202642 dated Apr. 3, 2018 with English Translation.

*Primary Examiner* — Thomas J. Hiltunen

(57) ABSTRACT

A slew rate adjusting circuit includes: a variable delay unit configured to delay an output of a signal source in response to a first control signal; an output buffer unit configured to adjust a slew rate in response to a second control signal; a differential buffer unit configured to compare the resulting signal output from the output buffer unit with a reference voltage; a first phase comparison unit configured to compare a phase of the output of the signal source with a phase of a signal; a first count unit configured to count the signal output from the first phase comparison unit and output the first control signal; and a second count unit configured to count the signal output from the second phase comparison unit and output the second control signal based on a count result.

10 Claims, 4 Drawing Sheets

(56) References Cited

U.S. PATENT DOCUMENTS

| | | | |
|---|---|---|---|
| 8,324,947 B2 * | 12/2012 | Ichikawa | G11C 29/02 |
| | | | 326/30 |
| 2006/0197568 A1 | 9/2006 | Takagi | |
| 2006/0256880 A1 * | 11/2006 | Frisch | G01R 31/31706 |
| | | | 375/257 |
| 2007/0001725 A1 * | 1/2007 | Atha | H03K 17/165 |
| | | | 327/172 |
| 2010/0237917 A1 * | 9/2010 | Monma | H03K 3/017 |
| | | | 327/158 |
| 2011/0043262 A1 | 2/2011 | Watanabe | |
| 2017/0126220 A1 * | 5/2017 | Elbadry | H03K 5/1565 |

* cited by examiner

SLEW RATE ADJUSTING CIRCUIT AND SLEW RATE ADJUSTING METHOD

This application is based upon and claims the benefit of priority from Japanese Patent Application No. 2016-202642, filed on Oct. 14, 2016, the disclosure of which is incorporated herein in its entirety by reference.

TECHNICAL FIELD

The present invention relates to a slew rate adjusting circuit and a slew rate adjusting method, and in particular relates to adjusting of slew rate, which is the maximum rate of change in voltage of a signal output from a circuit, such as a semiconductor device or the like, at high speed.

BACKGROUND ART

For example, when a rectangular pulse signal representing a binary value, that is, either "0" or "1", is output at a high speed from an output buffer of a Large Scale Integrated circuit (LSI) to a transmission path connected to the LSI, noise due to signal reflection or the like may arise when the pulse signal is input to a subsequent stage circuit. Such noise may cause a malfunction of the subsequent stage circuit. Thus, in order to make steep rising and falling of the waveform of the pulse signal more gradual, the adjustment of the slew rate for the pulse signal has been made. Here, the slew rate means the absolute value of a voltage change rate of a signal, and is represented by the value of a voltage that can rise per unit of time.

With respect to the slew rate for the pulse signal that is sent out to a transmission path at high speed, there is an appropriate range. For example, in the case where the slew rate is too small, the voltage change of a pulse signal becomes too slow, and as a result, a delay time until the voltage of the signal reaches a predetermined voltage increases. In the case where the slew rate is too large, the responsiveness to the voltage change is preferable, but, as described above, such a large slew rate may cause noise.

Thus, there is proposed a slew rate adjusting circuit configured to adjust a slew rate into an appropriate value that is empirically determined in accordance with the length of a transmission path and the state of signals output to the transmission path. For example, in Japanese Patent Application Laid-open No. 2006-245816 (JP2006-245816A), there is proposed a method that allows a slew rate to be adjusted using the difference between the periods of signals output from two different signal sources.

In the described-above slew rate adjustments in Background Art, however, there are disadvantages described below. In the case where, as in Japanese Patent Application Laid-open No. 2006-245816, the slew rate is adjusted using the difference between the periods of pulse signals output from two different signal sources, two signal sources are needed, and this causes increase in cost. Further, because of the existence of the signal sources that output signals having mutually different frequencies, the influence of asynchronous noise may increase.

SUMMARY

It is an object of the present invention to provide a slew rate adjusting circuit and a slew rate adjusting method that enable precise control of slew rate at low cost.

In order to achieve the object, a slew rate adjusting circuit according to an aspect of the present invention includes: a variable delay means configured to delay an output of a signal source in response to a first control signal, which is input to the variable delay means, and output a delayed signal; an output buffer means configured to adjust a slew rate in response to a second control signal, which is input to the output buffer means, and output a resulting signal; a differential buffer means configured to compare the resulting signal output from the output buffer means with a reference voltage and output a comparison result; a first phase comparison means configured to compare a phase of the output of the signal source with a phase of a signal obtained by delaying an output from the differential buffer means by a first feedback delay amount and output a signal based on a phase difference; a first count means configured to count the signal output from the first phase comparison means and output the first control signal based on a count result; a second phase comparison means configured to compare the phase of the output of the signal source with a phase of a signal obtained by delaying an output from the differential buffer means by a second feedback delay amount and output a signal based on a phase difference; and a second count means configured to count the signal output from the second phase comparison means and output the second control signal based on a count result.

A slew rate adjusting method according to another aspect of the present invention is a slew rate adjusting method for adjusting a slew rate of an output buffer means configured to amplify an output of an signal source and output a resulting signal, and adjust, through the use of a first feedback delay amount and a second feedback delay amount that determine a time of the slew rate, a delay difference created by a difference in reference voltage for the slew rate in such a way that the delay difference is substantially equal to a difference between the first feedback delay amount and the second feedback delay amount.

The present invention enables the precise control of slew rate at low cost.

BRIEF DESCRIPTION OF THE DRAWINGS

Exemplary features and advantages of the present invention will become apparent from the following detailed description when taken with the accompanying drawings in which.

EXAMPLE EMBODIMENT

Figure 1:
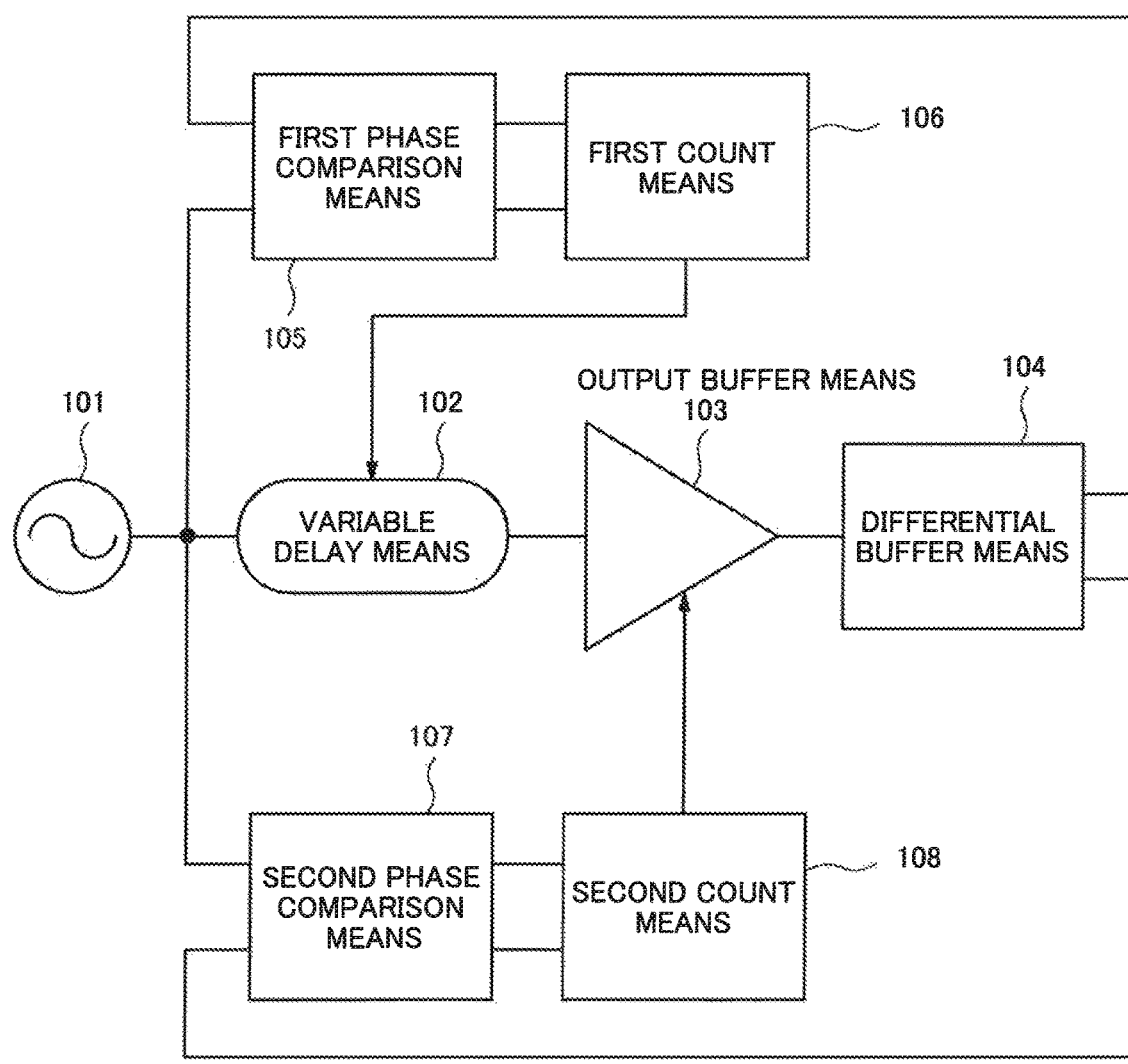
FIG. 1 is a block diagram illustrating a slew rate adjusting circuit according to a broader concept of the present invention.

Before describing a preferred example embodiment of the present invention, a slew rate adjusting circuit according to a broader concept of the present invention will be described. FIG. 1 is a block diagram illustrating the slew rate adjusting circuit according to the broader concept of the present invention.

The slew rate adjusting circuit 100 illustrated in FIG. 1 includes a signal source 101, a variable delay means 102 as an example of a variable delay unit, an output buffer means 103 as an example of an output buffer unit, a differential buffer means 104 as an example of a differential buffer unit, a first phase comparison means 105 as an example of a first phase comparison unit, a first count means 106 as an example of a first count unit, a second phase comparison means 107 as an example of a second phase comparison unit, and a second count means 108 as an example of a second count unit.

The signal source 101 outputs a rectangular pulse signal representing a binary value. The signal may be, for example, a signal to be output from a transmission circuit to a transmission path. The variable delay means 102 delays the output of the signal source 101 in response to a first control signal input to the variable delay means 102, and outputs a delayed signal. The output buffer means 103 has the function of adjusting a slew rate in response to a second control signal input to the output buffer means 103. The differential buffer means 104 compares the output of the output buffer means 103 with a reference voltage, and outputs a comparison result.

The first phase comparison means 105 compares the phase of the output of the signal source 101 with the phase of a signal obtained by delaying the signal output from the differential buffer means 104 by a first feedback delay amount, and outputs a phase comparison result based on the difference between the compared phases. The first count means 106 counts the output of the first phase comparison means 105, and outputs the first control signal based on a count result.

The second phase comparison means 107 compares the phase of the output of the signal source 101 with the phase of a signal obtained by delaying the signal output from the differential buffer means 104 by a second feedback delay amount, and outputs a phase comparison result based on the difference between the compared phases. The second count means 108 counts the output of the second phase comparison means 107, and outputs the second control signal based on a count result.

In the present example embodiment, in the slew rate adjustment by the output buffer means 103, which amplifies the output of the signal source 101 and outputs a resulting signal, the first feedback delay amount and the second feedback delay amount that determine a time of the slew rate are used. Further, a delay difference created by the difference in reference voltage for the slew rate is adjusted so as to be equal to the difference between the first feedback delay amount and the second feedback delay amount. With this configuration, in the present example embodiment, the time of the slew rate is adjusted using the difference between the first feedback delay amount and the second feedback delay amount as a reference. As a result, the slew rate can be automatically adjusted with high accuracy. In this case, in the present example embodiment, the adjustment of the slew rate is achieved using the single signal source 101, and thus, the slew rate can be adjusted at low cost. Hereinafter, a further specific example embodiment will be described in detail with reference to the drawings.

First Example Embodiment

Next, a slew rate adjusting circuit and a slew rate adjusting method according to a first example embodiment of the present invention will be described.

Figure 2:
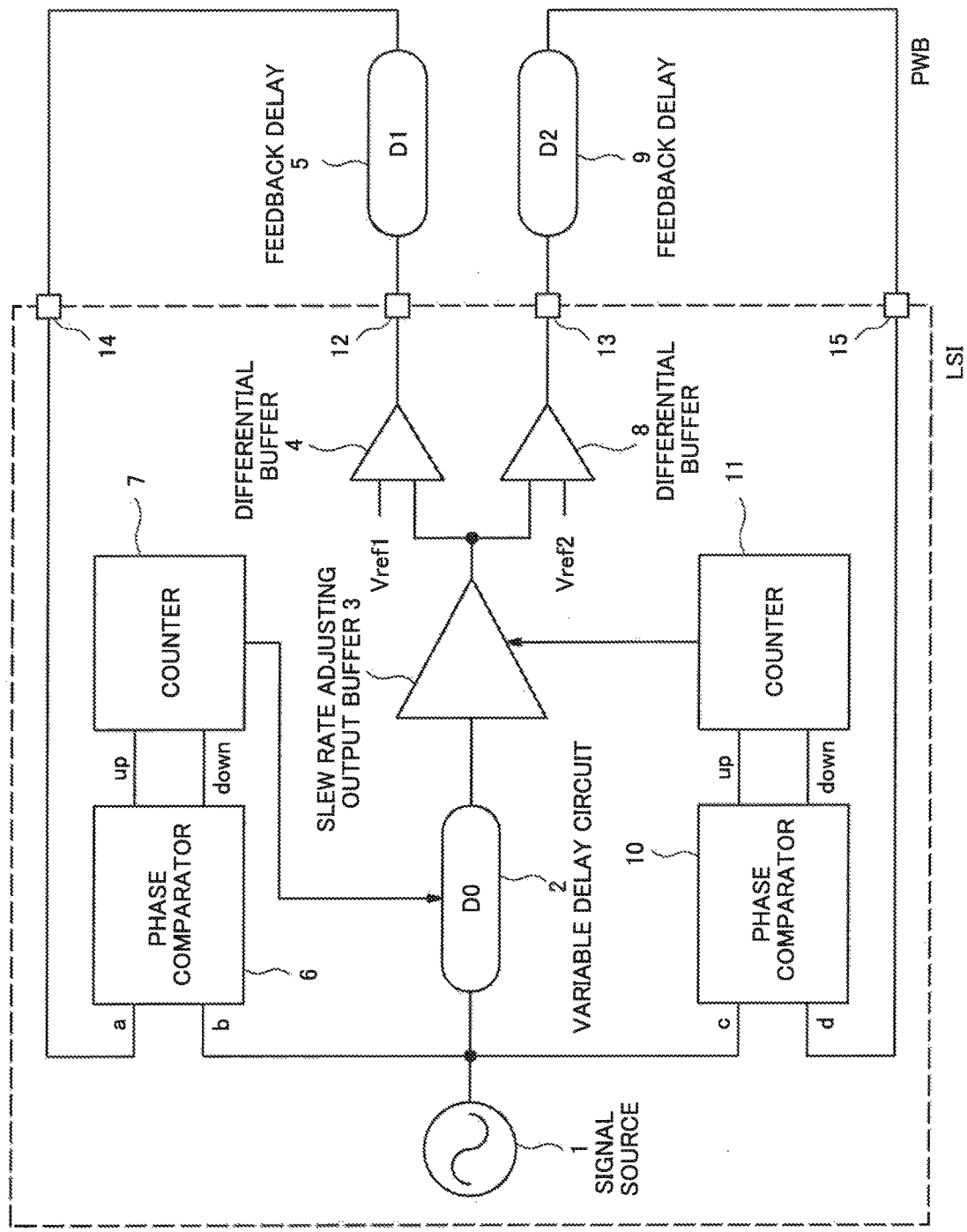
FIG. 2 is a block diagram illustrating a slew rate adjusting circuit according to a first example embodiment of the present invention.
Figure 3:
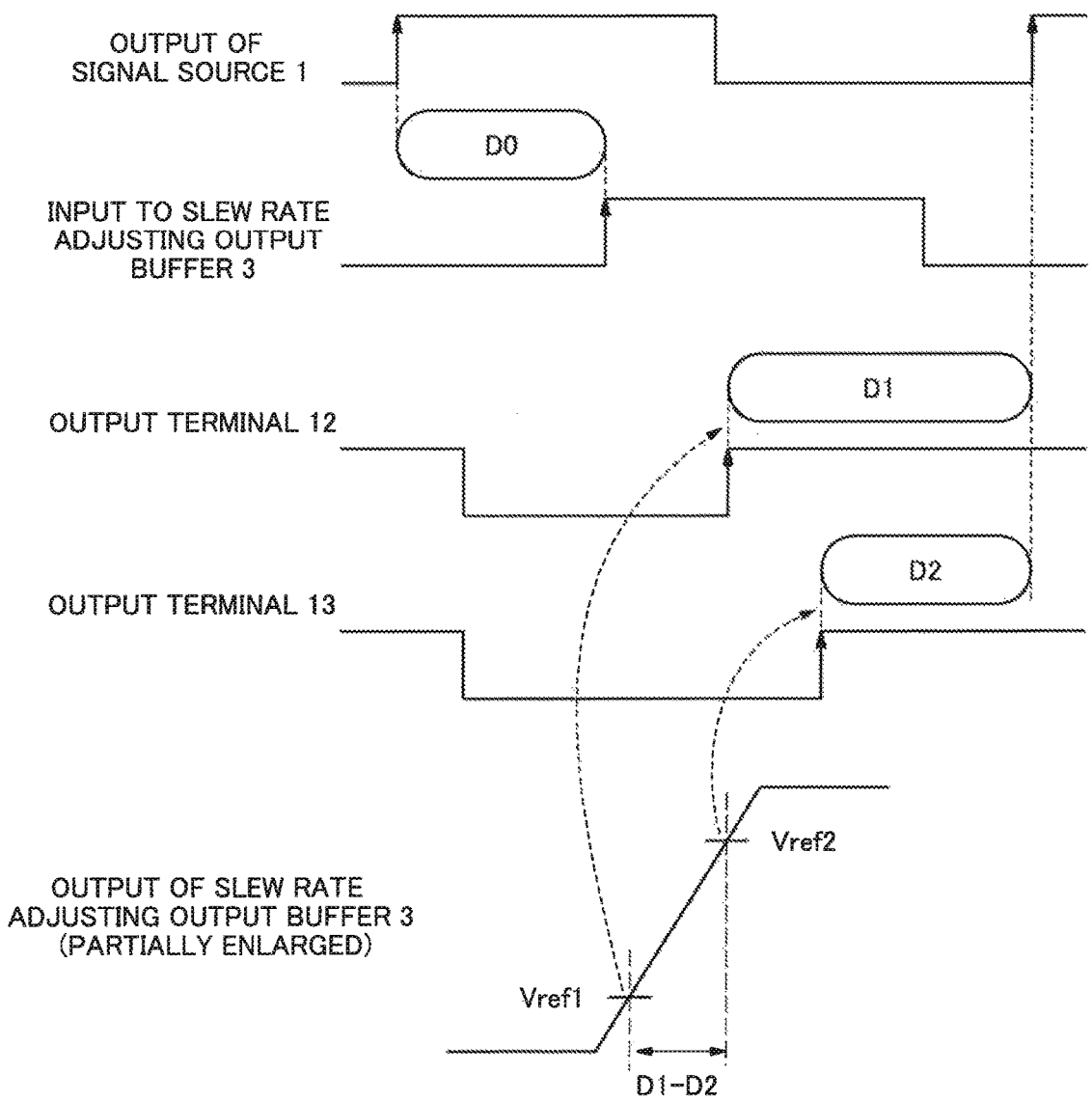
FIG. 3 is a timing chart illustrating the operation of the slew rate adjusting circuit illustrated in FIG. 2.

FIG. 2 is a block diagram illustrating the slew rate adjusting circuit according to this first example embodiment of the present invention. FIG. 3 is a timing chart illustrating the operation of the slew rate adjusting circuit illustrated in FIG. 2.

Configuration

The slew rate adjusting circuit of the present example embodiment includes: a signal source 1; a variable delay circuit 2 as an example of the variable delay means; a slew rate adjusting output buffer 3 as an example of the output buffer means; and differential buffers 4 and 8 as an example of the differential buffer means. Moreover, the slew rate adjusting circuit of the present example embodiment includes: a phase comparator 6 as an example of the first phase comparison means; a counter 7 as an example of the first count means; a phase comparator 10 as an example of the second phase comparison means; and a counter 11 as an example of the second count means. Furthermore, the slew rate adjusting circuit of the present example embodiment includes feedback delays 5 and 9.

As illustrated in a dotted line in FIG. 2, among the components of the slew rate adjusting circuit, for example, the signal source 1, the variable delay circuit 2, the slew rate adjusting output buffer 3, the differential buffers 4 and 8, the phase comparator 6, the counter 7, the phase comparator 10, and the counter 11 constitute an LSI. Further, such an LSI is mounted on a printed wiring board (PWB). As illustrated in FIG. 2, the LSI includes output terminal 12 and 13 and input terminal 14 and 15. In FIG. 2, there is illustrated an example in which the feedback delays 5 and 9 of the slew rate adjusting circuit are disposed on the PWB.

The signal source 1 outputs, for example, a rectangular pulse signal representing a binary value. The signal may be, for example, a signal to be output from a transmission circuit to a transmission path.

The variable delay circuit 2 delays the rectangular pulse signal output from the signal source 1 by a delay amount D0, which is varied in response to the output from the counter, and outputs a delayed signal. The delay amount D0 of the variable delay circuit 2 is controlled in such a way that a delay along a path from the variable delay circuit 2 to the slew rate adjusting output buffer 3 to the differential buffer 4 to the feedback delay 5 agrees with one period of the signal source 1 by use of a control signal from the counter 7 and the phase comparator 6.

The slew rate adjusting output buffer 3 includes a slew rate adjusting circuit and adjusts the slew rate in response to the output from the counter 11. Here, the slew rate is adjusted in such a way that a delay along a path from the variable delay circuit 2 to the slew rate adjusting output buffer 3 to the differential buffer 8 to the feedback delay 9 agrees with the period of the signal source 1.

The differential buffer 4 compares the output of the slew rate adjusting output buffer 3 with a reference voltage $V_{ref1}$, and outputs a rectangular pulse signal representing a binary value from the output terminal 12. The reference voltage $V_{ref1}$ is used for specifying the slew rate. The output of the differential buffer 4 is fed back as an input "a" to the phase comparator 6 via the feedback delay 5 having a delay amount D1 and the input terminal 14.

The differential buffer 8 compares the output of the slew rate adjusting output buffer 3 with a reference voltage $V_{ref2}$, and outputs a rectangular pulse signal representing a binary value from the output terminal 13. The output of the differential buffer 8 is fed back as an input "d" to the phase comparator 10 via the feedback delay 9 having a delay amount D2 and the input terminal 15. In the present example embodiment, the description is made by way of an example in which the reference voltage $V_{ref1}$ and the reference voltage $V_{ref2}$ are assumed to be set in accordance with a condition: the reference voltage $V_{ref1}$<the reference voltage $V_{ref2}$.

The phase comparator 6 receives the output of the differential buffer 4 via the feedback delay 5 as an input "a" and the output of the signal source 1 as an input "b", and outputs an output "up" and an output "down" that are generated based on the phase difference between the inputs "a" and "b". The counter 7 counts the output "up" and the output "down" of the phase comparator 6, and controls the delay amount D0 of the variable delay circuit 2 based on a count result.

The phase comparator 10 receives the output of the signal source 1 as an input "c" and the output of the differential buffer 8 via the feedback delay 9 as an input "d", and outputs an output "up" and an output "down" that are generated based on the phase difference between the inputs "c" and "d". The counter 11 counts the output "up" and the output "down" of the phase comparator 10, and controls the slew rate of the slew rate adjusting output buffer 3 based on a count result.

Operation

Next, the operation of the slew rate adjusting circuit illustrated in FIG. 2 as well as the slew rate adjusting method will be described with reference to waveforms illustrated in a timing chart of FIG. 3.

In FIG. 2, the signal "a" including a delay along the path from the variable delay circuit 2 to the slew rate adjusting output buffer 3 to the differential buffer 4 to the feedback delay 5 on the PWB and the signal "b", which is the output of the signal source 1, are input to the phase comparator 6.

When there is a shift between the phases of the signal "a" and the signal "b", the phase comparator 6 detects the direction of the shift and outputs a detection result as the output "up" or the output "down".

The delay amount D0 of the variable delay circuit 2 is increased or decreased by the counter 7, to which the outputs "up" and "down" are input. With the repetition of this operation, the sum of the delay amount along the path from the variable delay circuit 2 to the slew rate adjusting output buffer 3 to the differential buffer 4 and the delay amount D1 of the feedback delay 5 on the PWB becomes equal to one period of the signal source 1. Further, the phases of the signal "a" and the signal "b", which are signals input to the phase comparator 6 coincide with each other, and the slew rate adjusting circuit enters a stable state. In this state, as illustrated in FIG. 3, the phase of a signal at the output terminal 12 (namely, the phase of the output of the differential buffer 4) is brought into a state of being earlier compared with the phase of one period of the signal source 1 by the delay amount D1 of the feedback delay 5.

Next, the signal "d" including a delay along the path from the variable delay circuit 2 to the slew rate adjusting output buffer 3 to the differential buffer 8 to the feedback delay 9 on the PWB, and the signal "c", which is the output of the signal source 1, are input to the phase comparator 10. When there is a shift between the phases of the signal "c" and the signal "d", the phase comparator 10 detects the direction of the shift and outputs a detection result as the output "up" or the output "down". In order to allow the sum of the delay along the path from the variable delay circuit 2 that has been adjusted to the slew rate adjusting output buffer 3 to the differential buffer 8 and the delay amount D2 of the feedback delay 9 on the PWB to be equal to one period of the signal source 1, the phases of the signal "c" and the signal "d", which are signals input to the phase comparator 10, are set to be equal to each other, and then, the slew rate adjusting circuit enters a stable state. In this state, as illustrated in FIG. 3, the phase of a signal at the output terminal 13 (namely, the phase of the output of the differential buffer 8) is brought into a state of being earlier compared with the phase of one period of the signal source 1 by the delay amount D2 of the feedback delay 9.

The difference between the signal at the output terminal 12 (namely, the output of the differential buffer 4) and the signal at the output terminal 13 (namely, the output of the differential buffer 8) is a time difference caused by the difference between the reference voltage $V_{ref1}$ of the differential buffer 4 and the reference voltage $V_{ref2}$ of the differential buffer 8. When the reference voltages $V_{ref1}$ and $V_{ref2}$ are set in accordance with the condition: the reference voltage $V_{ref1}$<the reference voltage $V_{ref2}$, the rising and the falling of the output of the differential buffer 4 are respectively earlier than the rising and the falling of the output of the differential buffer 8. As illustrated in the partially enlarged waveform of the output of the slew rate adjusting output buffer 3 in FIG. 3, the slew rate can be adjusted in such a way that a period of time from a time point corresponding to the reference voltage $V_{ref1}$ until a time point corresponding to the reference voltage $V_{ref2}$ is equal to the difference (D1−D2) between the two feedback delays.

In this way, in the present example embodiment, through the use of the feedback delays 5 and 9 on the PWB, whose variations are smaller, the adjustment of the time of the slew rate can be made on the basis of the difference (D1−D2) between the two feedback delays. As a result, the slew rate can be automatically adjusted with high accuracy. In this case, in the present example embodiment, the adjustment of the slew rate is achieved using the single signal source 1, and thus, the slew rate can be adjusted at low cost.

Second Example Embodiment

Figure 4:
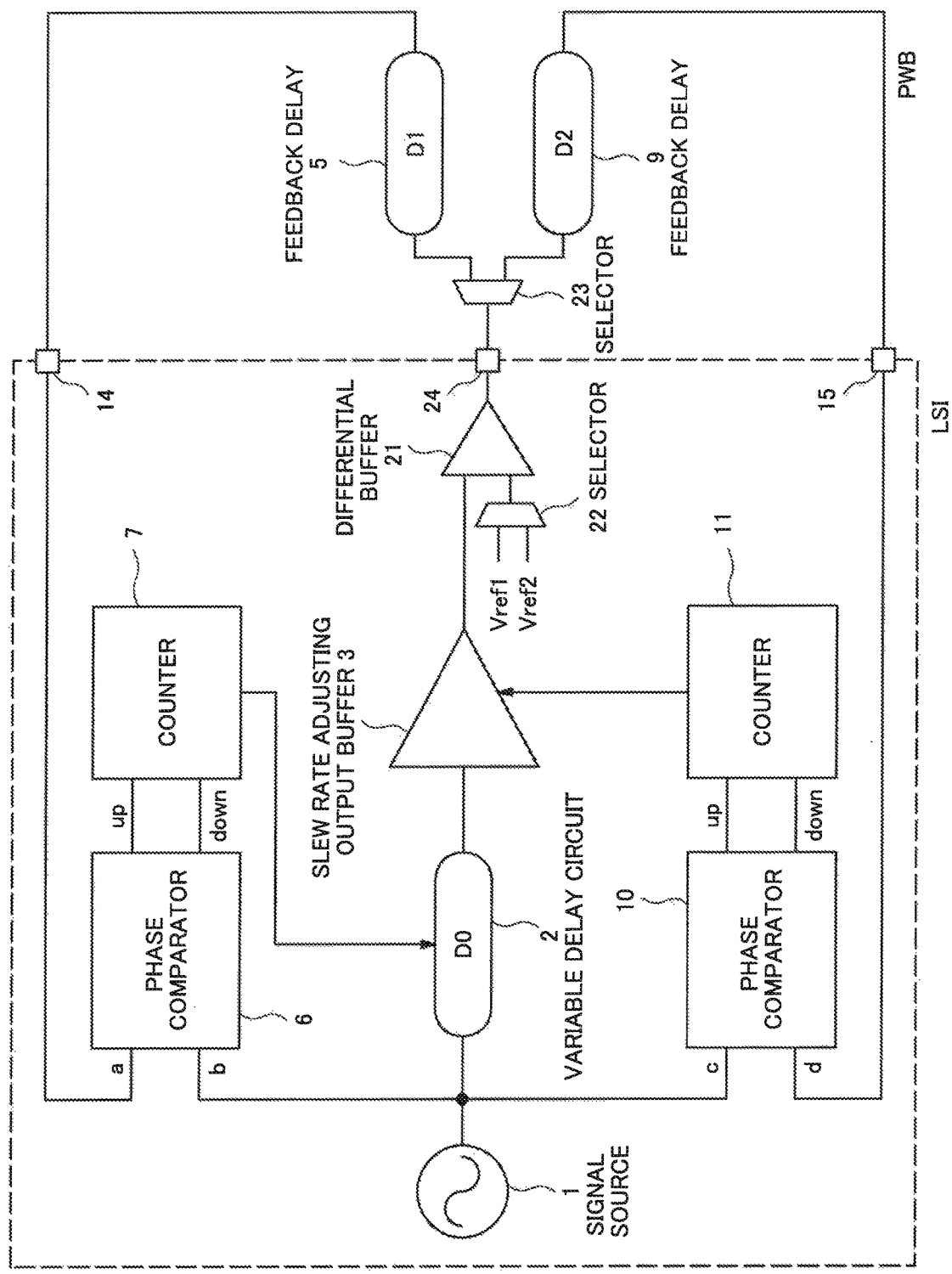
FIG. 4 is a block diagram illustrating a slew rate adjusting circuit according to a second example embodiment of the present invention.

Next, a slew rate adjusting circuit according to the second example embodiment of the present invention as well as a slew rate adjusting method implemented therein will be described. FIG. 4 is a block diagram illustrating the slew rate adjusting circuit according to this second example embodiment of the present invention.

The present example embodiment is an example embodiment that allows reference voltages of the differential buffer means to be selectable by selectors. Components illustrated in FIG. 2 and being similar to components included in the slew rate adjusting circuit according to the first example embodiment will be denoted by reference numbers identical to those of the components included in the slew rate circuit according to the first example embodiment, and thereby, will be omitted from detailed description.

Configuration

Similarly to the first example embodiment, the slew rate adjusting circuit according to the present example embodiment includes: a signal source 1; a variable delay circuit 2 as an example of the variable delay means; and a slew rate adjusting output buffer 3 as an example of the output buffer means. Moreover, similarly to the first example embodiment, the slew rate adjusting circuit according to the present example embodiment includes: a phase comparator 6 as an example of the first phase comparison means; a counter 7 as an example of the first count means; a phase comparator 10 as an example of the second phase comparison means; and a counter 11 as an example of the second count means. Furthermore, similarly to the first example embodiment, the slew rate adjusting circuit according to the present example embodiment includes feedback delays 5 and 9.

In the present example embodiment, a differential buffer 21, a selector 22, and a selector 23 are included as an example of the differential buffer means.

As illustrated in a dotted line in FIG. 4, among the components of the slew rate adjusting circuit, for example, the signal source 1, the variable delay circuit 2, the slew rate adjusting output buffer 3, the differential buffer 21, the selector 22, the phase comparator 6, the counter 7, the phase comparator 10, and the counter 11 constitute an LSI. Further, such an LSI is mounted on a printed wiring board (PWB). As illustrated in FIG. 4, the LSI includes an output terminal 24 and input terminal 14 and 15. In FIG. 4, there is illustrated an example in which the feedback delays 5 and 9 and the selector 23 of the slew rate adjusting circuit are disposed on the PWB.

Operation

Next, the operation of the slew rate adjusting circuit illustrated in FIG. 4 as well as the slew rate adjusting method will be described. In FIG. 4, the selector 22 selects the reference voltage $V_{ref1}$, and the selector 23 selects a path connected to the feedback delay 5. A signal including a delay along a path from the variable delay circuit 2 to the slew rate adjusting output buffer 3 to the differential buffer 21 to the feedback delay 5 on the PWB and a signal, which is the output of the signal source 1, are input to the phase comparator 6. The phase comparator 6 detects the direction of a shift between the two signals, and outputs a detection result as an output "up" or an output "down". The delay amount D0 of the variable delay circuit 2 is increased or decreased by the counter 7, to which the output "up" and the output "down" are input. With the repetition of this operation, the sum of the delay amount along the path from the variable delay circuit 2 to the slew rate adjusting output buffer 3 to the differential buffer 21 and the delay amount D1 of the feedback delay 5 on the PWB becomes equal to one period of the signal source 1. Further, the phases of the signals input to the phase comparator 6 coincide with each other, and the slew rate adjusting circuit enters a stable state.

Next, the selection states of the selector 22 and the selector 23 are switched. The selector 22 selects the reference voltage $V_{ref2}$, and allow the selector 23 selects a path connected to the feedback delay 9.

A signal including a delay along a path from the variable delay circuit 2 to the slew rate adjusting output buffer 3 to the differential buffer 21 to the feedback delay 9 on the PWB and a signal, which is the output of the signal source 1, are input to the phase comparator 10. The phase comparator 10 detects the direction of a shift between the two signals, and outputs a detection result as an output "up" or an output "down". In order to allow the sum of the delay along the path from the variable delay circuit 2 that has been adjusted to the slew rate adjusting output buffer 3 to the differential buffer 21 and the delay amount D2 of the feedback delay 9 on the PWB to be equal to one period of the signal source 1, the phases of the two signals input to the phase comparator 10 are set to be equal to each other, and then, the slew rate adjusting circuit enters a stable state.

The difference between a signal at the output terminal 24 (namely, the output of the differential buffer 21) when the selector 22 selects the reference voltage $V_{ref1}$ and a signal at the output terminal 24 (namely, the output of the differential buffer 21) when the selector 22 selects the reference voltage $V_{ref2}$ is a time difference caused by the difference between the reference voltages $V_{ref1}$ and $V_{ref2}$ for the differential buffer 21. As illustrated in the partially enlarged waveform of the output of the slew rate adjusting output buffer 3 in FIG. 3, the slew rate can be adjusted in such a way that a period of time from a time point corresponding to the reference voltage $V_{ref1}$ until a time point corresponding to the reference voltage $V_{ref2}$ is equal to the difference (D1−D2) between the two feedback delays.

In the present example embodiment, similarly to the first example embodiment, through the use of the feedback delays 5 and 9 on the PWB, whose variations are smaller, the adjustment of the time of the slew rate can be made on the basis of the difference (D1−D2) between the two feedback delays. As a result, the slew rate can be automatically adjusted with high accuracy similarly to the first example embodiment. In this case, in the present example embodiment, the adjustment of the slew rate is also achieved using the single signal source 1, and thus, the slew rate can be adjusted at low cost.

In the present example embodiment, a reference voltage for the differential buffer 21 is allowed to be selectable by the selector 22 from the two reference voltages $V_{ref1}$ and $V_{ref2}$, and a feedback path on the PWB is also allowed to be selectable by the selector 23. With this configuration, the reduction of the number of signals output to the PWB is achieved, and concurrently therewith, the same function as that of the slew rate adjusting circuit according to the first example embodiment is achieved.

Other Example Embodiments

One of the two feedback delays (the feedback delays 5 and 9) of each of the aforementioned first and second example embodiments may be made variable to allow the specified time of the slew rate to be freely variable.

The reference voltages $V_{ref1}$ and $V_{ref2}$ of each of the aforementioned first and second example embodiments may be supplied from the outside. In this way, the reference voltages $V_{ref1}$ and $V_{ref2}$, which specify the delays may be supplied from the outside, and thus, the specified voltage may be freely variable.

Heretofore, the preferred example embodiments of the present invention have been described, but the present invention is not limited to these example embodiments. Various modifications can be made within the scope of the present invention set forth in appended claims, and obviously, those are also included in the scope of the present invention.

The whole or part of the aforementioned example embodiments can be also described as, but are not limited to, the following supplementary notes.

(Supplementary Note 1)

A slew rate adjusting circuit includes a variable delay means configured to delay an output of a signal source in response to a first control signal, which is input to the variable delay means, and output a delayed signal; an output buffer means configured to adjust a slew rate in response to a second control signal, which is input to the output buffer means, and output a resulting signal; a differential buffer means configured to compare the resulting signal output from the output buffer means with a reference voltage and output a comparison result; a first phase comparison means configured to compare a phase of the output of the signal source with a phase of a signal obtained by delaying an output from the differential buffer means by a first feedback delay amount and output a signal based on a phase difference; a first count means configured to count the signal output from the first phase comparison means and output the first control signal based on a count result; a second phase comparison means configured to compare the phase of the output of the signal source with a phase of a signal obtained by delaying an output from the differential buffer means by a second feedback delay amount and output a signal based on a phase difference; and a second count means configured to count the signal output from the second phase comparison means and output the second control signal based on a count result.

(Supplementary Note 2)

In the slew rate adjusting circuit according to Supplementary Note 1, the first feedback delay amount and the second feedback delay amount are different from each other.

(Supplementary Note 3)

In the slew rate adjusting circuit according to Supplementary Note 1 or Supplementary Note 2, the differential buffer means includes a first differential buffer means configured to compare the resulting signal output from the output buffer means with a first reference voltage and output a comparison result, and a second differential buffer means configured to compare the resulting signal output from the output buffer means with a second reference voltage and output another comparison result.

(Supplementary Note 4)

In the slew rate adjusting circuit according to Supplementary Note 1 or Supplementary Note 2, the differential buffer means compares the resulting signal output from the output buffer means with one of a first reference voltage and a second reference voltage and output a comparison result.

(Supplementary Note 5)

In the slew rate adjusting circuit according to Supplementary Note 4, the differential buffer means further includes a first selector and a second selector. The first selector selects one of the first reference voltage and the second reference voltage, and the second selector selectively outputs a signal resulting from a comparison between a selected one of the first reference voltage and the second reference voltage and the resulting signal output from the output buffer means to either the first phase comparison means or the second phase comparison means.

(Supplementary Note 6)

In the slew rate adjusting circuit according to any one of Supplementary Notes 3 to 5, the first reference voltage and the second reference voltage are different from each other.

(Supplementary Note 7)

A slew rate adjusting method for adjusting a slew rate of an output buffer means configured to amplify an output of an signal source and output a resulting signal includes, through the use of a first feedback delay amount and a second feedback delay amount that determine a time of the slew rate, a step of adjusting a delay difference created by a difference in reference voltage for the slew rate in such a way that the delay difference is substantially equal to a difference between the first feedback delay amount and the second feedback delay amount.

(Supplementary Note 8)

The slew rate adjusting method according to Supplementary Note 7 uses a slew rate adjusting circuit including a variable delay means configured to delay an output of a signal source in response to a first control signal, which is input to the variable delay means, and output a delayed signal; an output buffer means configured to adjust a slew rate in response to a second control signal, which is input to the output buffer means, and output a resulting signal; a differential buffer means configured to compare the resulting signal output from the output buffer means with a reference voltage and output a comparison result; a first phase comparison means configured to compare a phase of the output of the signal source with a phase of a signal obtained by delaying an output from the differential buffer means by a first feedback delay amount and output a signal based on a phase difference; a first count means configured to count the signal output from the first phase comparison means and output the first control signal based on a count result; a second phase comparison means configured to compare the phase of the output of the signal source with a phase of a signal obtained by delaying an output from the differential buffer means by a second feedback delay amount and output a signal based on a phase difference; and a second count means configured to count the signal output from the second phase comparison means and output the second control signal based on a count result. Further, a delay amount of the variable delay means is adjusted in response to the first feedback delay amount, and the slew rate of the output buffer is adjusted in response to the second feedback delay amount.

(Supplementary Note 9)

In the slew rate adjusting method according to Supplementary Note 8, the differential buffer means compares the resulting signal output from the output buffer means with a first reference voltage and outputs a comparison result, and compares the resulting signal output from the output buffer means with a second reference voltage and output another comparison result.

(Supplementary Note 10)

In the slew rate adjusting method according to Supplementary Note 9, the first reference voltage and the second reference voltage are different from each other.

(Supplementary Note 11)

In the slew rate adjusting method according to Supplementary Note 9 or Supplementary Note 10, the first reference voltage and the second reference voltage are set such that a difference between the first reference voltage and the second reference voltage corresponds to a difference between the first feedback delay amount and the second feedback delay amount.

The previous description of embodiments is provided to enable a person skilled in the art to make and use the present invention. Moreover, various modifications to these exemplary embodiments will be readily apparent to those skilled in the art, and the generic principles and specific examples defined herein may be applied to other embodiments without the use of inventive faculty. Therefore, the present invention is not intended to be limited to the exemplary embodiments described herein but is to be accorded the widest scope as defined by the limitations of the claims and equivalents.

Further, it is noted that the inventor's intent is to retain all equivalents of the claimed invention even if the claims are amended during prosecution.

The invention claimed is:

1. A slew rate adjusting circuit comprising:
   a variable delay unit configured to delay an output of a signal source in response to a first control signal, which is input to the variable delay unit, and output a delayed signal;
   an output buffer unit configured to adjust a slew rate in response to a second control signal, which is input to the output buffer unit, and output a resulting signal;
   a differential buffer unit configured to compare the resulting signal output from the output buffer unit with a reference voltage and output a comparison result;
   a first phase comparison unit configured to compare a phase of the output of the signal source with a phase of a signal obtained by delaying an output from the differential buffer unit by a first feedback delay amount and output a signal based on a phase difference;

a first count unit configured to count the signal output from the first phase comparison unit and output the first control signal based on a count result;

a second phase comparison unit configured to compare the phase of the output of the signal source with a phase of a signal obtained by delaying an output from the differential buffer unit by a second feedback delay amount and output a signal based on a phase difference; and a second count unit configured to count the signal output from the second phase comparison unit and output the second control signal based on a count result.

2. The slew rate adjusting circuit according to claim 1, wherein the first feedback delay amount and the second feedback delay amount are different from each other.

3. The slew rate adjusting circuit according to claim 1, wherein the differential buffer unit includes a first differential buffer unit configured to compare the resulting signal output from the output buffer unit with a first reference voltage and output a comparison result, and a second differential buffer unit configured to compare the resulting signal output from the output buffer unit with a second reference voltage and output another comparison result.

4. The slew rate adjusting circuit according to claim 3, wherein the first reference voltage and the second reference voltage are different from each other.

5. The slew rate adjusting circuit according to claim 1, wherein the differential buffer unit compares the resulting signal output from the output buffer unit with one of a first reference voltage and a second reference voltage and output a comparison result.

6. The slew rate adjusting circuit according to claim 5, wherein the differential buffer unit further includes a first selector and a second selector, the first selector being configured to select one of the first reference voltage and the second reference voltage, the second selector being configured to selectively output a signal resulting from a comparison between a selected one of the first reference voltage and the second reference voltage and the resulting signal output from the output buffer unit to either the first phase comparison unit or the second phase comparison unit.

7. A slew rate adjusting method for adjusting a slew rate of an output buffer unit configured to amplify an output of a signal source and output a resulting signal, the slew rate adjusting method comprising:

through a use of a first feedback delay amount and a second feedback delay amount that determine a time of the slew rate, adjusting a delay difference created by a difference in a plurality of reference voltages for the slew rate in such a way that the delay difference is substantially equal to a difference between the first feedback delay amount and the second feedback delay amount, wherein the slew rate adjusting method uses a slew rate adjusting circuit including a variable delay unit configured to delay an output of a signal source in response to a first control signal, which is input to the variable delay unit and output a delayed signal, the output buffer unit configured to adjust a slew rate in response to a second control signal input to the output buffer unit, and output a resulting signal, a differential buffer unit configured to compare the resulting signal output from the output buffer unit with a reference voltage and output a comparison result, a first phase comparison unit configured to compare a phase of the output of the signal source with a phase of a signal obtained by delaying an output from the differential buffer unit by a first feedback delay amount and output a signal base on a phase difference, a first count unit configured to count the signal output from the first phase comparison unit and output the first control signal based on a count result, a second phase comparison unit configured to compare the phase of the output of the signal source with a signal obtained by delaying an output from the differential buffer unit by a second feedback delay amount and output a signal based on a phase difference, and a second count unit configured to count the signal output from the second phase comparison unit and output the second control signal based on a count result, and wherein a delay amount of the variable delay unit is adjusted in response to the first feedback delay amount, and the slew rate of the output buffer is adjusted in response to the second feedback delay amount.

8. The slew rate adjusting method according to claim 7, wherein the differential buffer unit compares the resulting signal output from the output buffer unit with a first reference voltage and output a comparison result, and compares the resulting signal output from the output buffer unit with a second reference voltage and output another comparison result.

9. The slew rate adjusting method according to claim 8, wherein the first reference voltage and the second reference voltage are different from each other.

10. The slew rate adjusting method according to claim 8, wherein the first reference voltage and the second reference voltage are set such that a difference between the first reference voltage and the second reference voltage corresponds to a difference between the first feedback delay amount and the second feedback delay amount.

* * * * *